United States Patent
Liu et al.

(10) Patent No.: US 10,692,940 B2
(45) Date of Patent: Jun. 23, 2020

(54) PIXEL STRUCTURE AND DISPLAY PANEL HAVING THE SAME

(71) Applicant: KUNSHAN GO-VISIONOX OPTO-ELECTRONICS CO., LTD., Kunshan (CN)

(72) Inventors: Jiang Liu, Kunshan (CN); Ji Cheng, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 0 days.

(21) Appl. No.: 16/524,342

(22) Filed: Jul. 29, 2019

(65) Prior Publication Data

US 2019/0355795 A1    Nov. 21, 2019

Related U.S. Application Data

(63) Continuation of application No. PCT/CN2018/090014, filed on Jun. 5, 2018.

(30) Foreign Application Priority Data

Aug. 31, 2017   (CN) .......................... 2017 1 0775318

(51) Int. Cl.
 *H01L 27/32* (2006.01)
(52) U.S. Cl.
 CPC ...... *H01L 27/3218* (2013.01); *H01L 27/3216* (2013.01)
(58) Field of Classification Search
 CPC . H01L 27/3218; H01L 27/3216; H01L 51/50; H01L 27/32; G09G 3/3225
 See application file for complete search history.

(56) References Cited

U.S. PATENT DOCUMENTS 8,552,636 B2    10/2013  Chaji et al.
2003/0160915 A1*  8/2003  Liu ................... G02F 1/133514
                                                                349/106

(Continued)

FOREIGN PATENT DOCUMENTS

CA        2686174 A1    6/2011
CN      102714213 A    10/2012

(Continued)

OTHER PUBLICATIONS

Office Action dated Sep. 3, 2019, in corresponding Chinese Application No. 201710775318.0; 14 pages.

(Continued)

*Primary Examiner* — Victor A Mandala
(74) *Attorney, Agent, or Firm* — Maier & Maier, PLLC

(57) ABSTRACT

A pixel structure and a display panel having the pixel structure are disclosed by the present application. The pixel structure includes a plurality of pixel units arranged in an array. The pixel units are arranged respectively along a first direction and a second direction perpendicular to the first direction. Each of the plurality of pixel units comprises a first sub-pixel, a second sub-pixel, and a third sub-pixel which have different colors. In the second direction, a distance between the third sub-pixels is different from a distance between the first sub-pixels and is different from a distance between the second sub-pixels. According to the pixel structure of the present application, the pixel units can be arranged more compact, therefore the pixel pitch is reduced and the PPI is improved.

13 Claims, 8 Drawing Sheets

(56) References Cited

U.S. PATENT DOCUMENTS

| | | | |
|---|---|---|---|
| 2008/0001525 A1 | 1/2008 | Chao et al. | |
| 2012/0056531 A1 | 3/2012 | Park et al. | |
| 2015/0009104 A1 | 1/2015 | Kim et al. | |
| 2015/0287767 A1 | 10/2015 | Lee et al. | |
| 2016/0155781 A1* | 6/2016 | Chaji | H01L 27/3218 257/89 |
| 2016/0203748 A1* | 7/2016 | Matsueda | G09G 3/2003 345/694 |
| 2016/0240593 A1* | 8/2016 | Gu | G09G 3/3225 |
| 2017/0039924 A1* | 2/2017 | Jin | H01L 27/3218 |
| 2019/0011830 A1* | 1/2019 | Ji | H01L 27/3246 |
| 2019/0140030 A1* | 5/2019 | Huangfu | G09G 3/3233 |
| 2019/0206310 A1* | 7/2019 | Tian | H01L 27/32 |
| 2019/0294284 A1* | 9/2019 | Akimoto | H01L 51/5281 |
| 2019/0326365 A1* | 10/2019 | Jin | H01L 27/3218 |

FOREIGN PATENT DOCUMENTS

| | | |
|---|---|---|
| CN | 103123927 A | 5/2013 |
| CN | 103985316 A | 8/2014 |
| CN | 104009066 * | 8/2014 ........ 27/32 |
| CN | 104009066 A | 8/2014 |
| CN | 103311266 B | 10/2015 |
| CN | 105448951 A | 3/2016 |
| CN | 105552099 A | 5/2016 |
| CN | 206322697 U | 7/2017 |
| CN | 108010934 A | 5/2018 |
| CN | 108091667 A | 5/2018 |
| CN | 106449710 B | 5/2019 |
| EP | 2507837 A2 | 10/2012 |
| TW | 201428956 A | 7/2014 |
| WO | 2011067729 A3 | 8/2011 |

OTHER PUBLICATIONS

Translation of International Search Report and Written Opinion dated Aug. 28, 2018 in corresponding International application No. PCT/CN2018/090014; 10 pgs.

Taiwanese Office Action dated Jun. 5, 2019 in corresponding application No. TW107120048; 6 pgs.

* cited by examiner

PIXEL STRUCTURE AND DISPLAY PANEL HAVING THE SAME

FIELD

Exemplary embodiments of the present application relate to display technologies, and in particular, to pixel structures and display panels having the same.

BACKGROUND

An Organic Light-Emitting Diode (OLED) is an active light-emitting device. Compared with the conventional Liquid Crystal Display (LCD) display method, the OLED display technology does not require a backlight source and has self-luminous characteristics. The OLED adopts relative thin organic material film layers and a glass substrate. The organic material film layer emits light when an electric current passes through. Therefore, an OLED display panel can significantly save power, can be made lighter and thinner, can withstand a wider range of temperature variations than an LCD display panel, and has a larger viewing angle. The OLED display panel is expected to be the next-generation flat panel display technology after the LCD, and is one of the most popular technologies in the current flat panel display technologies.

There are many colorization methods for OLED screens. At present, the OLED colorization technology that is relatively mature and has been successfully mass-produced is mainly an OLED evaporation technology, which uses the conventional RGB Stripe arrangement for evaporation. The side-by-side method has the best picture effect. In the side-by-side method, three sub-pixels of Red, Green, and Blue (R, G, B) exist in the range of a pixel. Each sub-pixel comprises a shape of quadrangle, and each has an independent organic light-emitting component. An evaporation film forming technology is adopted to form an organic light-emitting component at a corresponding pixel position on an array substrate through a Fine Metal Mask (FMM). The FMM is generally referred to as a metal mask or an evaporation mask. The technology of fabricating an OLED display panel with a high Pixel Per Inch (PPI) focuses on the fine and mechanically stable FMM and the arrangement of pixels (sub-pixels).

FIG. 1 is a schematic diagram showing a pixel arrangement of an OLED display panel in the prior art. As shown in FIG. 1, the OLED display panel adopts a side-by-side method for the pixel. Each pixel unit Pixel includes an R sub-pixel region 101, a G sub-pixel region 103, and a B sub-pixel region 105. The R sub-pixel region 101 includes an R light-emitting region 102 and an R non-light-emitting region (not labeled), the G sub-pixel region 103 includes a G light-emitting region 104 and a G non-light-emitting region (not labeled), and the B sub-pixel region 105 includes a B light-emitting region 106 and a B non-light-emitting region (not labeled). The R, G, and B sub-pixel regions shown in FIG. 1 as well as the light-emitting regions thereof are respectively equal in area. The R, G, and B sub-pixels are arranged in a straight line. Specifically, the light-emitting region of each sub-pixel region includes a cathode, an anode, and an electroluminescent layer (also called an organic light-emitting layer). The electroluminescent layer is located between the cathode and the anode to generate light of a predetermined color to achieve display. During a preparation of the display panel of the prior art, it is generally necessary to utilize a three-time evaporation process to form electroluminescent layers of corresponding colors (R, G, or B) in the light-emitting regions of the corresponding color pixel regions, respectively.

The OLED display panel shown in FIG. 1 is generally evaporated by using the FMM shown in FIG. 2. The FMM includes a shielding region 107 and a plurality of evaporation openings 108. The shielding region between adjacent two evaporation openings 108 in the same column is called a bridge. To avoid the shadowing effect on the sub-pixels during evaporation, a sufficient distance has to be maintained between the sub-pixels and the bridge, which causes decrease in the lengths of the sub-pixels, and the aperture ratio of each sub-pixel is affected. The conventional RGB side-by-side pixel arrangement can only reach 200-300 PPI at most, which is difficult to achieve a high-resolution display effect. With the increasing demands of users to the resolution of the OLED display panel, this RGB pixel side-by-side arrangement can no longer meet the design requirements of a high PPI of the product.

FIG. 3 is a schematic diagram showing a pixel arrangement of another OLED display panel in the prior art. As shown in FIG. 3, only the G sub-pixel is used exclusively for each pixel unit, and the R and B sub-pixels are shared with adjacent pixel units. For example, a pixel unit 201 and a pixel unit 202 share the R sub-pixel. In this way, the PPI of the display screen can be improved. However, in this arrangement, as the R and B sub-pixels are shared by adjacent pixel units, the entire display effect may be distorted, which is not a full-color display in a true sense.

SUMMARY

The inventors have found through research that the conventional RGB pixel arrangement cannot simultaneously meet the requirements of the aperture ratio and display effect of the product. On this basis, exemplary embodiments of the present application provide pixel structures and display panels having the same to solve the problems existing in the prior art.

To solve the foregoing technical problems, the present application provides a pixel structure, comprising a plurality of pixel units arranged in an array, the pixel units being arranged respectively along a first direction and a second direction perpendicular to the first direction, each of the pixel units comprising a first sub-pixel, a second sub-pixel, and a third sub-pixel having different colors; and in the second direction, a distance between the third sub-pixels is different from a distance between the first sub-pixels and is different from a distance between the second sub-pixels.

Alternatively, in the second direction, the distance between the third sub-pixels is greater than the distance between the first sub-pixels and is greater than the distance between the second sub-pixels.

Alternatively, in the second direction, the distance between the third sub-pixels is smaller than the distance between the first sub-pixels and is smaller than the distance between the second sub-pixels.

Alternatively, the distance between the first sub-pixels is equal to the distance between the second sub-pixels.

Alternatively, in each pixel unit, a total size of the first sub-pixel and the second sub-pixel is greater than a size of the third sub-pixel in the second direction.

Alternatively, in each pixel unit, a size of the pixel unit in the first direction is greater than a size of the pixel unit in the second direction.

Alternatively, in each pixel unit, a ratio of the size of the pixel unit in the first direction to the size of the pixel unit in the second direction is 3:2, 2:1, 4:3 or 5:4.

Alternatively, in a plurality of adjacent pixel units in the first direction, a size of a light-emitting region of the third sub-pixel in the first direction is incremented or decremented, the plurality of adjacent pixel units are performed as a plurality of repeat unit groups repeatedly arranged in the first direction and the second direction, or in a plurality of adjacent pixel units in the second direction, a size of a light-emitting region of the third sub-pixel in the second direction is incremented or decremented, and the plurality of adjacent pixel units are performed as a plurality of repeat unit groups repeatedly arranged in the first direction and the second direction.

Alternatively, a number of the plurality of adjacent pixel units is three or more.

In each pixel unit, the first sub-pixel and the second sub-pixel are arranged collinearly in the second direction, the third sub-pixel and the first sub-pixel and the second sub-pixel are arranged side by side in the first direction.

Alternatively, an inverted arrangement structure of each pixel unit is the same as an arrangement structure of a pixel unit adjacent to the pixel unit in the second direction, or an inverted arrangement structure of each pixel unit is the same as an arrangement structure of a pixel unit adjacent to the pixel unit in the first direction.

Alternatively, the first sub-pixel, the second sub-pixel and the third sub-pixel are respectively one of an R sub-pixel, a G sub-pixel, and a B sub-pixel.

Alternatively, the first direction is a row direction and the second direction is a column direction; or the first direction is a column direction and the second direction is a row direction.

According to another aspect of the present application, the present application provides a display panel, comprising a pixel structure, wherein the pixel structure comprises a plurality of pixel units arranged in an array, the plurality of pixel units being arranged respectively along a first direction and a second direction perpendicular to the first direction, each of the pixel units comprising a first sub-pixel, a second sub-pixel, and a third sub-pixel having different colors;

in the second direction, a distance between the third sub-pixels being different from a distance between the first sub-pixels, and being different from a distance between the second sub-pixels.

1. The present application provides a pixel structure of a display panel. Each pixel unit is arranged adjacent to each other respectively along a row direction or a column direction. Each pixel unit consists of three sub-pixels of different colors, so that a full-color display in the true sense can be realized.

2. Each pixel unit includes a first sub-pixel, a second sub-pixel and a third sub-pixel. The first sub-pixel and the second sub-pixel are arranged in a column, and the third sub-pixel is arranged in another column. A total size of the first sub-pixel and the second sub-pixel in the column direction is larger than a size of the third sub-pixel in the column direction. The arrangement structure of the pixel units in the same row is the same. Moreover, an inverted arrangement structure of each pixel unit is the same as an arrangement structure of an adjacent pixel unit in the same column. The pixel units can be arranged more compact, therefore the pixel pitch is reduced, and the PPI is improved. Moreover, when the first sub-pixel and the second sub-pixel are arranged in a column, the third sub-pixels of adjacent two pixel units in the same column are arranged in a staggered manner, which can reduce the difficulty of the manufacturing process and the evaporation process of the evaporation mask.

3. The pixel units of different columns are arranged in a misaligned manner, which can better ameliorate the problem of the green light lines and red light lines on the upper and lower sides of the display region of the screen. A size of a sub-pixel in the row direction or the column direction is different from a size of the other two sub-pixels in the row direction or the column direction, and preferably, the size of the B sub-pixel is greater than the size of the R sub-pixel and the G sub-pixel, which can fundamentally overcome the defect that the brightness of existing local/single point is too bright or the attenuation of the service life is too fast, so as to better balance the service life of B sub-pixels from the perspective of full screen and slow down the color cast caused by a fast local attenuation.

DETAILED DESCRIPTION

Figure 1:
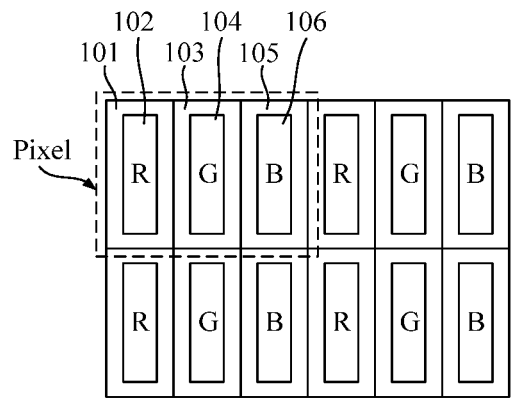
FIG. 1 is a schematic diagram showing a pixel arrangement of a display panel in the prior art.
Figure 2:
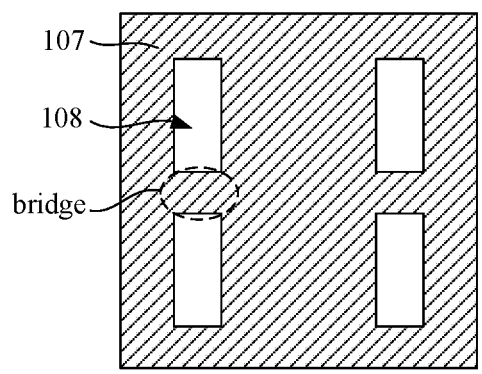
FIG. 2 is a schematic diagram of an FMM corresponding to FIG. 1.
Figure 3:
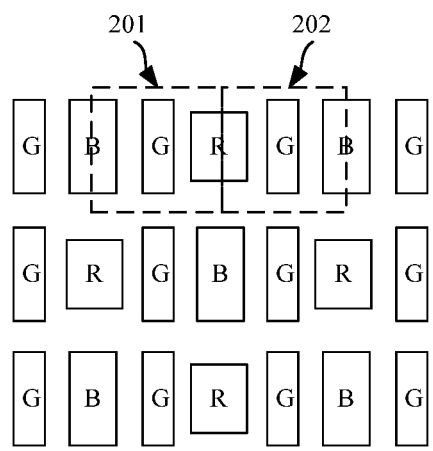
FIG. 3 is a schematic diagram showing a pixel arrangement of another display panel in the prior art.

The rows and columns described in the present application, as well as the left and right, are referenced to the drawings in the present application, and do not refer to the rows and columns as well as the left and right in actual products. For example, the "row direction" in the present application may be the X direction, and the "column direction" may be the Y direction (the second direction). However, the meanings of "row" and "column" of the present application are not limited only to the "row" and "column" in the conventional sense, but also the "row" and "column" formed by simultaneously clockwise or counterclockwise rotation of the "row" and "column" in the conventional sense by 90 degrees. In the following embodiments, the same or similar parts are denoted by the same or similar reference numerals.

Embodiment 1

Figure 4:
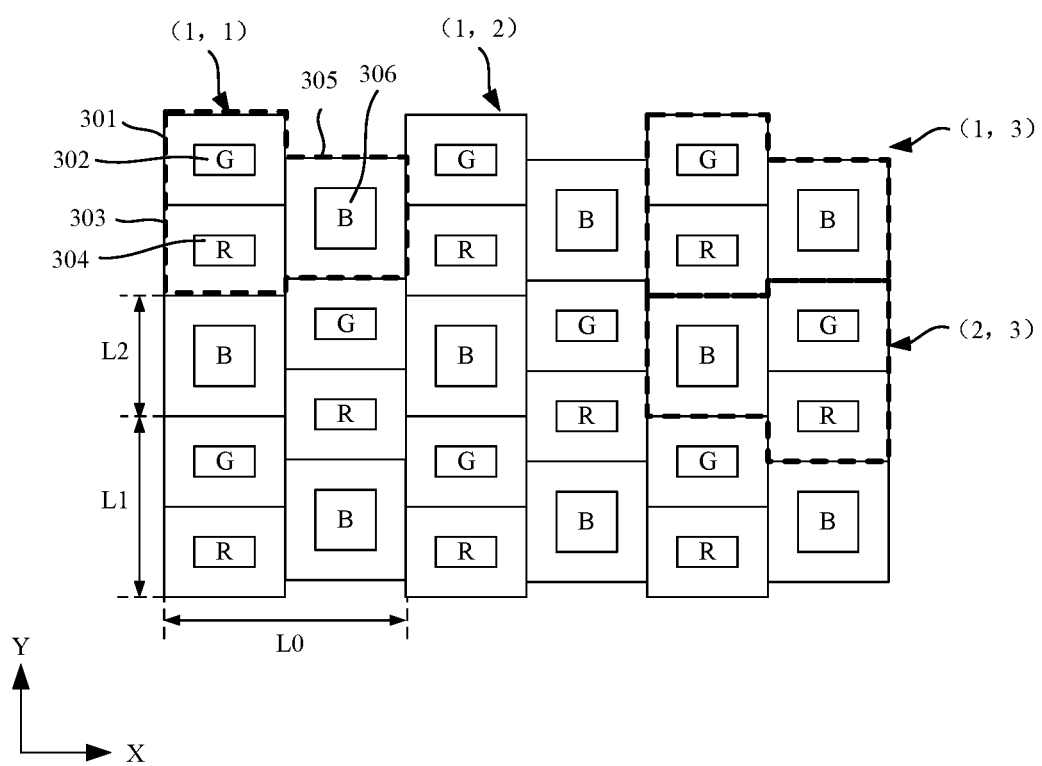
FIG. 4 is a schematic diagram showing a pixel arrangement of a display panel according to Embodiment 1 of the present application.

FIG. 4 is a schematic diagram showing a pixel arrangement of a display panel according to Embodiment 1 of the present application. The X direction is referred to as the row direction (horizontal direction), and the Y direction is referred to as the column direction (vertical direction). For the sake of simplicity, only a part of the OLED display panel is shown in the drawing. The number of pixels in the actual product is not limited thereto, and the number of pixel units can be correspondingly changed according to the actual display needs.

As shown in FIG. 4, the pixel structure of the display panel includes a plurality of pixel units arranged in an array, each of the pixel units including a first sub-pixel 301, a second sub-pixel 303, and a third sub-pixel 305. In the same pixel unit, the first sub-pixel 301 and the second sub-pixel 303 are arranged in a column, and the third sub-pixel 305 is arranged in another column. The total size L1 of the first sub-pixel 301 and the second sub-pixel 303 in the column direction (i.e., the sum of the sizes of the first sub-pixel 301 and the second sub-pixel 303 in the column direction) is greater than the size L2 of the third sub-pixel 305 in the column direction. The arrangement structure of all the pixel units in the same row is the same, and the arrangement structure of each pixel unit flipped in the row direction (flipping to right and left) is the same as the arrangement structure of adjacent pixel cells in the same column. In this way, the pixel units can be arranged more compact, the pixel pitch is reduced, and the PPI is improved. Moreover, each pixel unit consists of three colors of RGB, and a full-color display in the true sense can be realized.

Further, since the arrangement of the pixel units in the present application is more compact, the total size of the pixel units in the row direction can be made larger, so that the total size of the pixel units in the row direction (i.e., the maximum size of the pixel units in the row direction) is greater than the maximum size of the pixel unit in the column direction (i.e., the sum of the sizes of the first sub-pixel 301 and the second sub-pixel 303 in the column direction), that is, L0 is greater than L1, such as L0:L1=3:2. In this case, compared with the conventional square pixel unit (the ratio of the size in the row direction to the size in the column direction is 1:1). The two pixel units in this embodiment can realize the display effect of the conventional three pixel units. Certainly, the present application does not limit the specific proportional relationship of L0 and L1. The ratio of the total size L0 of the pixel units in the row direction to the maximum size L1 of the pixel unit in the column direction may also be 2:1, 4:3, 5:4 and etc.

The pixel unit in the first row and the first column is denoted as a pixel unit (1, 1), the pixel unit in the first row and the second column is denoted as a pixel unit (1, 2), the pixel unit in the second row and the first column is recorded as a pixel unit (2, 1), and the pixel unit in the second row and the second column is referred to as a pixel unit (2, 2), and so on. As shown in FIG. 4, the arrangement structure of the pixel unit (1, 3) in the first row and the third column after being flipped 180 degrees to the right is the same as the arrangement structure of a pixel unit in the adjacent row and the same column, i.e., the pixel unit (2, 3) in the second row and the third column. In view of the above, the third sub-pixels of two adjacent pixel units on the same column, for example, the third sub-pixels of the pixel units (1, 3) and the pixel unit (2, 3) are arranged in a staggered manner, that is, the third sub-pixels of the pixel unit (1, 3) and the pixel unit (2, 3) in the column direction are not arranged in a straight line, and therefore, the evaporation openings on the FMM for forming the third sub-pixels are also arranged in a staggered manner, thereby reducing the difficulties of the manufacturing process and the evaporation process of the evaporation mask.

In this embodiment, the light-emitting regions of the first sub-pixel 301, the second sub-pixel 303, and the third sub-pixel 305 can be arranged in a "triangular form", an inverted "triangular form", a "triangular form" rotating 90 degrees to the left, or a "triangular form" rotating 90 degrees to the right, and can also be approximately in a "triangular form", an inverted "triangular form", a "triangular form" rotating 90 degrees to the left, or a "triangular form" rotating 90 degrees to the right. In the arrangement structure shown in FIG. 4, in the odd-numbered rows of pixel units, a light-emitting region 302 of the first sub-pixel 301, a light-emitting region 304 of the second sub-pixel 303, and a light-emitting region 306 of the third sub-pixel 305 are arranged in a "triangular form" rotating 90 degrees to the right (an approximately "triangular form"), that is, the first sub-pixel 301 and the second sub-pixel 303 are arranged on the left side, and the third sub-pixel 305 is arranged on the right side. In the even-numbered rows of pixel units, the light-emitting region 302 of the first sub-pixel 301, the light-emitting region 304 of the second sub-pixel 303, and the light-emitting region 306 of the third sub-pixel 305 are arranged in a "triangular form" rotating 90 degrees to the left (an approximately "triangular form"), that is, the third sub-pixel 305 is arranged on the left side, and the first sub-pixel 301 and the second sub-pixel 303 are arranged on the right side. Further, the first sub-pixels 301 of all the pixel units in the same row are arranged in a straight line, and the second sub-pixels of all the pixel units in the same row are also arranged in a straight line.

Figure 5:
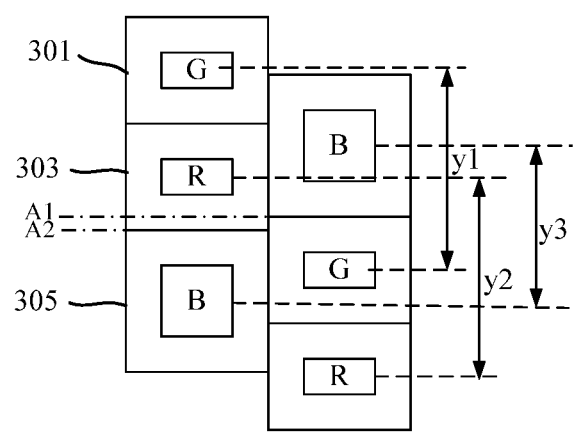
FIG. 5 is a structural schematic diagram of two pixel units adjacent in a column direction in a display panel according to Embodiment 1 of the present application.

In this embodiment, in the pixel units of the same column, the distance of the adjacent first sub-pixels 301 in the column direction is equal to the distance of the adjacent second sub-pixels 303 in the column direction. The distance of the adjacent first sub-pixels 301 in the column direction and the distance of the adjacent second sub-pixels 303 in the column direction are greater than the distance of the adjacent third sub-pixels 305 in the column direction. Specifically, as shown in FIG. 5, in the pixel units of the same column, the distance y1 of the adjacent first sub-pixels 301 in the column direction is different from the distance y2 of the adjacent second sub-pixels 303 in the column direction, and each of the distance y1 of the adjacent first sub-pixels 301 in the column direction and the distance y2 of the adjacent second sub-pixels 303 in the column direction is greater than the distance y3 of the adjacent third sub-pixels 305 in the column direction.

Preferably, in the same pixel unit, a lower surface of the third sub-pixel 305 in the column direction is higher than or equal to a lower surface of the second sub-pixel 303 in the column direction, that is, a plane (such as A1 in FIG. 5) where the lower surface of the third sub-pixel 305 in the column direction is located is higher than or equal to (i.e., not lower than) a plane (such as A2 in FIG. 5) where the lower surface of the second sub-pixel 303 in the column direction is located, thereby preventing the third sub-pixel 305 from being far apart from the first sub-pixel 301 and the second sub-pixel 303 to affect the display. Preferably, in the same pixel unit, the distance between a center line of the third sub-pixel 305 extending in the row direction and a boundary line between the first sub-pixel 301 and the second sub-pixel 303 is smaller than or equal to 10 μm.

In this embodiment, the first sub-pixel 301 is a G sub-pixel, the second sub-pixel 303 is an R sub-pixel, and the third sub-pixel 305 is a B sub-pixel. Therefore, the first sub-pixel 301 includes a G light-emitting region 302 and a G non-light-emitting region (not labeled), and includes an organic light-emitting layer for emitting green light. The second sub-pixel 303 includes an R light-emitting region 304 and an R non-light-emitting region (not labeled), and includes an organic light-emitting layer for emitting red light. The third sub-pixel 305 includes a B light-emitting region 306 and a B non-light-emitting region (not labeled), and includes an organic light-emitting layer for emitting blue light. Since the luminous efficiency of the B sub-pixel is generally the lowest, and accordingly, the required light-emitting area is larger, and therefore, the light-emitting area of the third sub-pixel 305 is larger than the light-emitting areas of the first sub-pixel 301 and the second sub-pixel 303. In other embodiments, the first sub-pixel 301 may also be an R sub-pixel, the second sub-pixel 303 may also be a G sub-pixel. The first sub-pixel and the second sub-pixel may be interchanged.

In a preferred embodiment, the first sub-pixel 301 and the second sub-pixel 303 have the same shape and area, that is, are symmetrically distributed by a mirror image. It should be noted that since the first sub-pixel 301 and the second sub-pixel 303 in the same pixel unit share an edge, the shared edge is a boundary line between the first sub-pixel 301 and the second sub-pixel 303. However, it should be understood that the "boundary" or "boundary line" herein is not limited to a physical "boundary" or "boundary line", but may refer to a virtual "boundary" or "boundary line" between two pixel sub-pixels.

In this embodiment, the shapes of the first sub-pixel 301 and the second sub-pixel 303 are a rectangle, the shape of the third sub-pixel 305 is a square. The first sub-pixel 301 and the second sub-pixel 303 are arranged along the short side thereof. The side length (height) of the light-emitting region 306 of the third sub-pixel 305 is twice the short side length of the light-emitting region 302 of the first sub-pixel 301 and the short side length (height) of the light-emitting region 304 of the second sub-pixel 303. It should be understood that the shapes of the first sub-pixel 301, the second sub-pixel 303, and the third sub-pixel 303 are not limited to a rectangle, and may be other quadrangles other than the rectangle, or one or any combination of polygons such as a triangle, a pentagon, a hexagon, and an octagon. Moreover, the areas of the first sub-pixel 301 and the second sub-pixel 303 may not be equal, and the light-emitting area of the third sub-pixel 305 is not limited to be twice the light-emitting area of the first sub-pixel 301 or the second sub-pixel 303. The shape and/or area of each sub-pixel can be correspondingly adjusted according to the color matching requirements.

Embodiment 2

Figure 6:
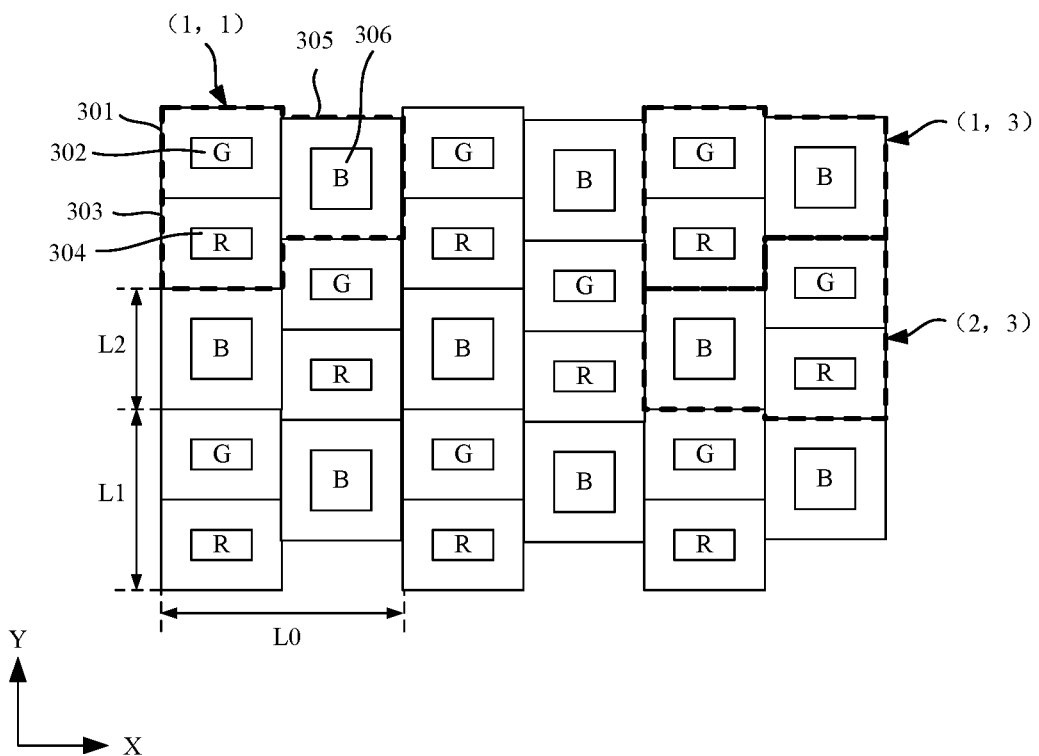
FIG. 6 is a schematic diagram showing a pixel arrangement of a display panel according to Embodiment 2 of the present application.

FIG. 6 is a schematic diagram showing a pixel arrangement of a display panel according to Embodiment 2 of the present application. Embodiment 2 differs from Embodiment 1 in that in the pixel units of the same column, the distance of the adjacent first sub-pixels 301 in the column direction is equal to the distance of the adjacent second sub-pixels 303 in the column direction, and the distance of the adjacent first sub-pixels 301 in the column direction and the distance of the adjacent second sub-pixels 303 in the column direction are smaller than the distance of the adjacent third sub-pixels 305 in the column direction.

Figure 7:
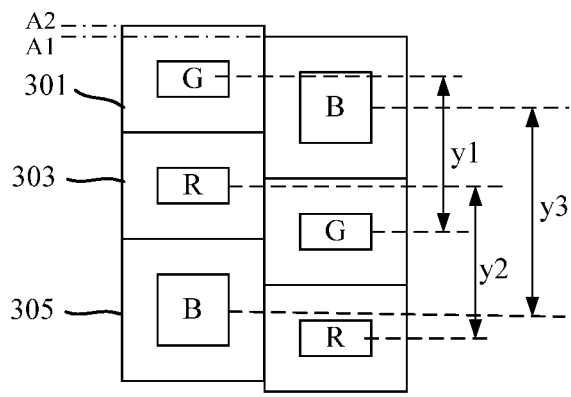
FIG. 7 is a structural schematic diagram of two pixel units adjacent in a column direction in a display panel according to Embodiment 2 of the present application.

Specifically, as shown in FIG. 7, in the pixel units of the same column, the distance y1 of the adjacent first sub-pixels 301 in the column direction is equal to the distance y2 of the adjacent second sub-pixels 303 in the column direction, and each of the distance y1 of the adjacent first sub-pixels 301 in the column direction and the distance y2 of the adjacent second sub-pixels 303 in the column direction is smaller than the distance y3 of the adjacent third sub-pixels 305 in the column direction. Preferably, in the same pixel unit, an upper surface of the third sub-pixel 305 in the column direction is lower than or equal to an upper surface of the first sub-pixel 301 in the column direction, that is, a plane (such as A1 in FIG. 7) where the upper surface of the third sub-pixel 305 in the column direction is located is lower than or equal to (i.e., not higher than) a plane (such as A2 in FIG. 7) where the upper surface of the first sub-pixel 301 in the column direction is located, thereby preventing the third sub-pixel 305 from being far apart from the first sub-pixel 301 and the second sub-pixel 303 to affect the display. Preferably, in the same pixel unit, the distance between a center line of the third sub-pixel 305 extending in the row direction and a boundary line between the first sub-pixel 301 and the second sub-pixel 303 is smaller than or equal to 10 μm.

Embodiment 3

Figure 8:
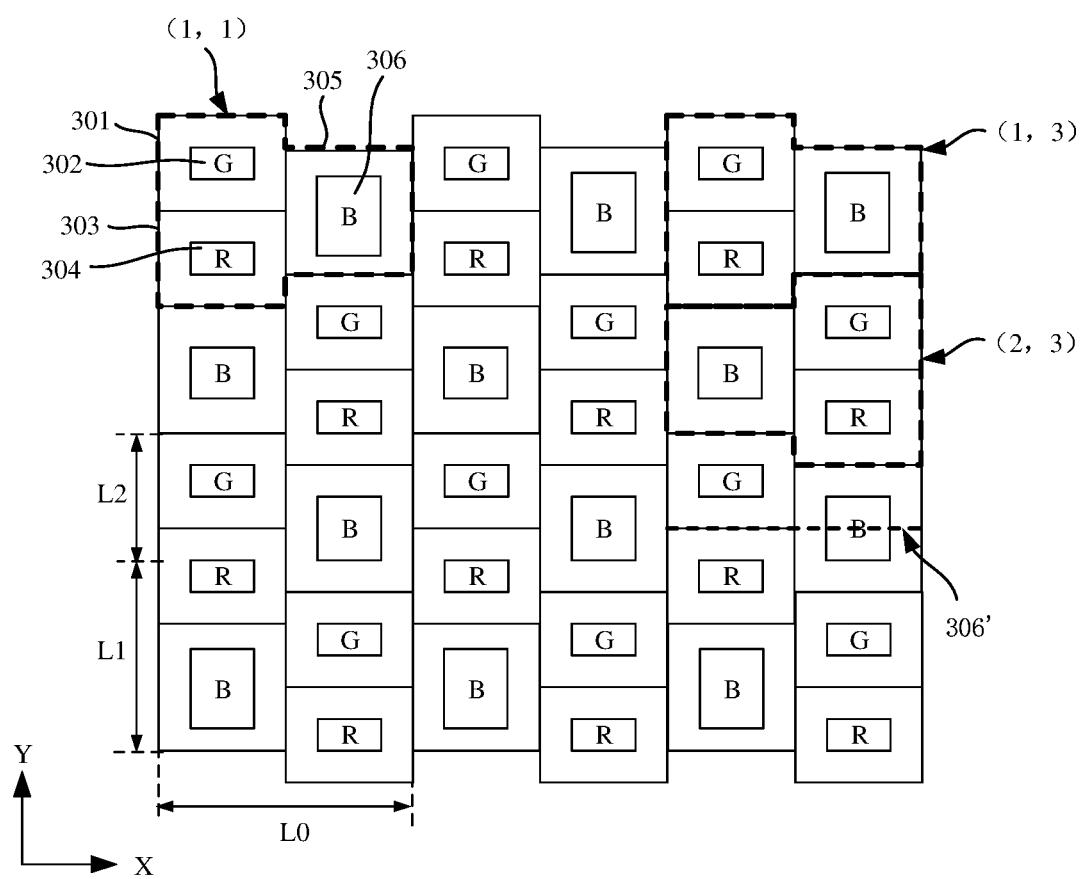
FIG. 8 is a schematic diagram showing a pixel arrangement of a display panel according to Embodiment 3 of the present application.

FIG. 8 is a schematic diagram showing a pixel arrangement of a display panel according to Embodiment 3 of the present application. There are two differences between Embodiment 3 and Embodiment 1.

Difference 1: in Embodiment 3, the center line of the third sub-pixel 305 extending in the row direction coincides with the boundary line between the first sub-pixel 301 and the second sub-pixel 303 in each pixel unit, so that the pixel pitch is further reduced, the PPI of the display screen is improved, and the RGB sub-pixels are uniformly distributed, thereby obtaining a better display effect. Specifically, referring to FIG. 8, a center line 306' of the third sub-pixel 305 extending in the row direction (the center line 306' divides the third sub-pixel 305 into two parts equally and the center line 306' extends in the row direction) coincides with the boundary line between the first sub-pixel 301 and the second sub-pixel 303.

Figure 9:
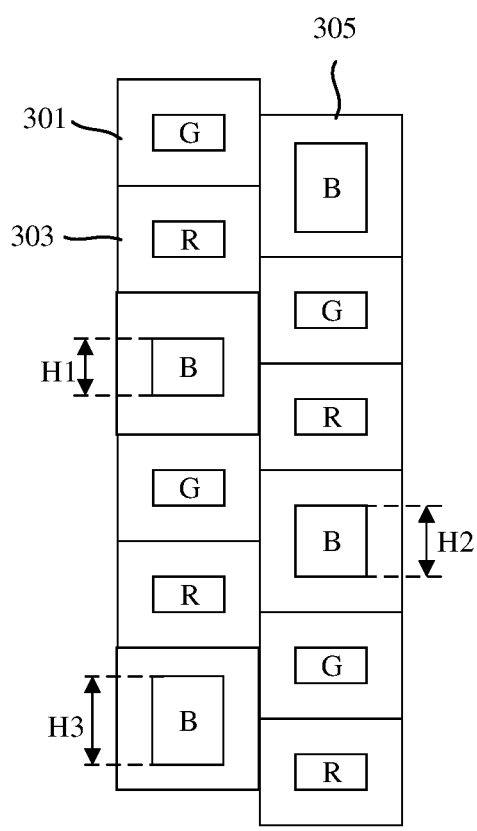
FIG. 9 is a structural schematic diagram of three pixel units adjacent in a column direction in a display panel according to Embodiment 3 of the present application.

Difference 2: in Embodiment 3, in a plurality of adjacent pixel units in the same column, the sizes of the light-emitting regions of the third sub-pixels in the column direction are incremented (the sizes of the light-emitting regions are incremented while the sizes of the third sub-pixels remain unchanged; or the sizes of the light-emitting regions and the third sub-pixels both are incremented), and the plurality of adjacent pixel units where the third sub-pixels with incremented sizes of the light-emitting regions are located are performed as a plurality of repeat unit groups repeatedly arranged in the column direction. Preferably, in three adjacent pixel units in the same column, the sizes of the light-emitting regions of the three third sub-pixels in the column direction are incremented. Specifically, as shown in FIG. 9, the sizes H1, H2, and H3 of the light-emitting regions of the three third sub-pixels 305 in the column direction are incremented. The three adjacent pixel units are used as a repeat unit group repeatedly arranged in the column direction, that is, in the column direction, any three of the third sub-pixels 305 are performed as a group, and the sizes of the light-emitting regions of the three third sub-pixels vary according to H1, H2, H3, H1, H2, H3, . . . . Preferably, the size ratio of the light-emitting regions of the three third sub-pixels 305 in the column direction is H1:H2: H3=3:4:5. Certainly, the sizes of the light-emitting regions of the third sub-pixels in four or more adjacent pixel units of the same column in the column direction may be incremented, but it is required to meet the following condition: in the same pixel unit, the total size of the first sub-pixel 301 and the second sub-pixel 303 in the column direction is greater than the size of the third sub-pixel 305 in the column direction.

The size of the B sub-pixel is greater than the size of the R sub-pixel and is greater than the size of the G sub-pixel, which can fundamentally overcome the defect that the brightness of the existing local/single point is too bright or the attenuation of the service life is too fast, so as to better balance the service life of B sub-pixels from the perspective of full screen, and slow down the color cast caused by a fast local attenuation.

Embodiment 4

Figure 10:
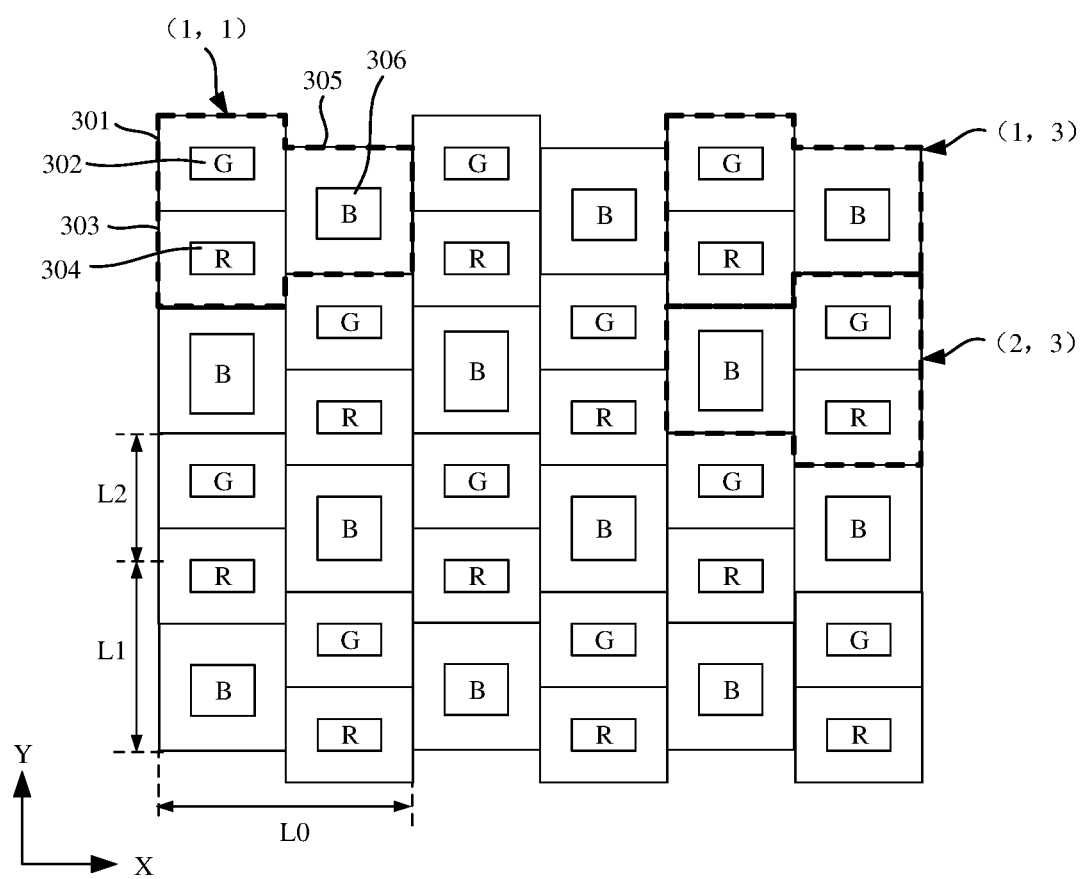
FIG. 10 is a schematic diagram showing a pixel arrangement of a display panel according to Embodiment 4 of the present application.
Figure 11:
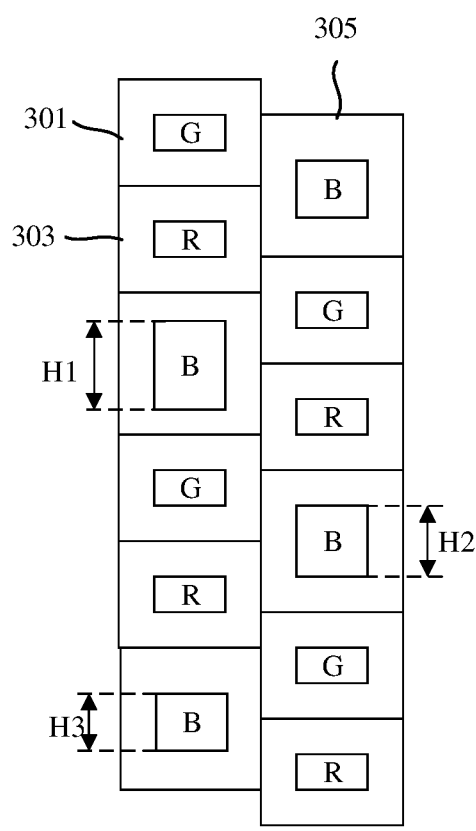
FIG. 11 is a structural schematic diagram of three pixel units adjacent in a column direction in a display panel according to Embodiment 4 of the present application.

FIG. 10 is a schematic diagram showing a pixel arrangement of a display panel according to Embodiment 4 of the present application. Embodiment 4 differs from Embodiment 3 in that in a plurality of adjacent pixel units in the same column, the sizes of the light-emitting regions of the third sub-pixels in the column direction are decremented (the sizes of the light-emitting regions are decremented while the sizes of the third sub-pixels remain unchanged; or the sizes of the light-emitting regions and the third sub-pixels both are decremented), and the plurality of adjacent pixel units where the third sub-pixels with decremented sizes of the light-emitting regions are located are performed as a plurality of repeat unit groups repeatedly arranged in the column direction. Preferably, in three adjacent pixel units in the same column, the sizes of the light-emitting regions of the three third sub-pixels in the column direction are decremented. Specifically, as shown in FIG. 11, the sizes H1, H2, and H3 of the light-emitting regions of the three third sub-pixels 305 in the column direction are decremented, and the three adjacent pixel units are performed as a plurality of repeat unit groups repeatedly arranged in the column direction, that is, in the column direction, any three of the third sub-pixels 305 are performed as a group, and the sizes of the light-emitting regions of the third sub-pixels vary according to H1, H2, H3, H1, H2, H3, . . . . Preferably, the size ratio of the light-emitting regions of the three third sub-pixels 305 in the column direction is H1:H2:H3=5:4:3. Certainly, the sizes of the light-emitting regions of the third sub-pixels in four or more adjacent pixel units of the same column in the column direction may be decremented, but it is required to meet the following condition: in the same pixel unit, the total size of the first sub-pixel 301 and the second sub-pixel 303 in the column direction is greater than the size of the third sub-pixel 305 in the column direction.

In the above embodiment, in the odd-numbered rows of pixel units, the light-emitting region 302 of the first sub-pixel 301, the light-emitting region 304 of the second sub-pixel 303, and the light-emitting region 306 of the third sub-pixel 305 are arranged in a "triangular form" rotating 90 degrees to the right, that is, the first sub-pixel 301 and the second sub-pixel 303 are arranged on the left side, and the third sub-pixel 305 is arranged on the right side. In the even-numbered rows of pixel units, the light-emitting region 302 of the first sub-pixel 301, the light-emitting region 304 of the second sub-pixel 303, and the light-emitting region 306 of the third sub-pixel 305 are arranged in a "triangular form" rotating 90 degrees to the left, that is, the third sub-pixel 305 is arranged on the left side, and the first sub-pixel 301 and the second sub-pixel 303 are arranged on the right side.

In other embodiments, the pixel units can also be arranged as follows: in the odd-numbered rows of pixel units, the light-emitting region 302 of the first sub-pixel 301, the light-emitting region 304 of the second sub-pixel 303, and the light-emitting region 306 of the third sub-pixel 305 are arranged in a "triangular form" rotating 90 degrees to the left, that is, the third sub-pixel 305 is arranged on the left side, and the first sub-pixel 301 and the second sub-pixel 303 are arranged on the right side. In the even-numbered rows of pixel units, the light-emitting region 302 of the first sub-pixel 301, the light-emitting region 304 of the second sub-pixel 303, and the light-emitting region 306 of the third sub-pixel 305 are arranged in a "triangular form" rotating 90 degrees to the right, that is, the first sub-pixel 301 and the second sub-pixel 303 are arranged on the left side, and the third sub-pixel 305 is arranged on the right side.

Embodiment 5

Figure 12:
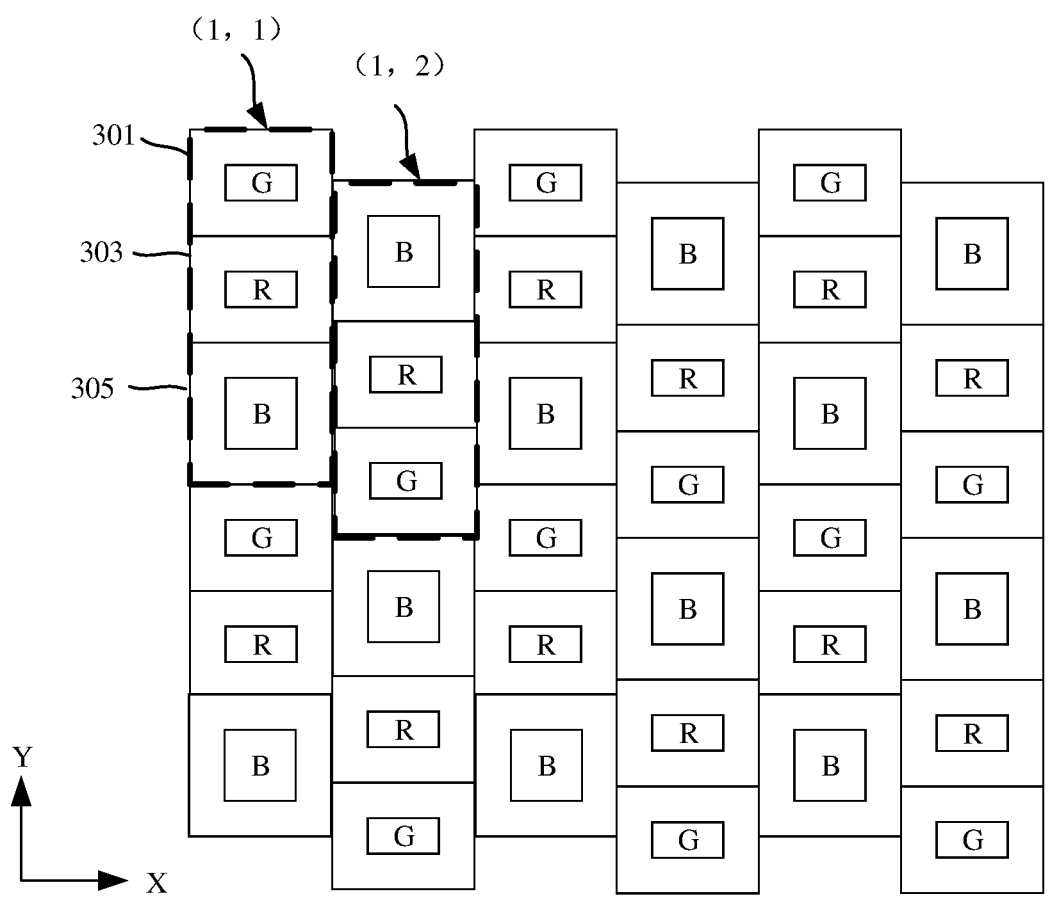
FIG. 12 is a schematic diagram showing a pixel arrangement of a display panel according to Embodiment 5 of the present application.

FIG. 12 is a schematic diagram showing a pixel arrangement of a display panel according to Embodiment 5 of the present application. Embodiment 5 differs from the foregoing embodiment in that in Embodiment 5, three sub-pixels included in a pixel unit are arranged in a row direction or a column direction, and the pixel units of different rows or different columns are arranged in a misaligned manner.

As shown in FIG. 12, the pixel unit includes a first sub-pixel 301, a second sub-pixel 303, and a third sub-pixel 305. The first sub-pixel 301, the second sub-pixel 303, and the third sub-pixel 305 are arranged in one column. The arrangement structure of the pixel units in the same column is the same, and the arrangement structure of each pixel unit after being flipped 180 degrees in the column direction is the same as the arrangement structure of pixel units adjacent to the pixel unit in the row direction. For example, the pixel unit (1, 1) in the first row and the first column includes a first sub-pixel 301, a second sub-pixel 303, and a third sub-pixel 305 arranged in the column direction. The arrangement structure of the pixel unit (1, 1) after being flipped 180 degrees in the column direction is: the third sub-pixel 305, the second sub-pixel 303, and the first sub-pixel 301, which is the same as the arrangement of the pixel unit (1, 2) in the first row and the second column.

The arrangement structure of the pixel units in the same column is the same, and the pixel units of different columns are arranged in a misaligned manner, that is, two ends of adjacent two columns of pixel units are not aligned, which can better ameliorate the problem of the green light lines and red light lines on the upper and lower sides of the display region of the screen.

Embodiment 6

Embodiment 6 provides a display panel, which can adopt the pixel structure according to any one of Embodiments 1 to 5.

The pixel structure and the display panel having the pixel structure proposed in the present application are described in detail in the above embodiments. However, it should be understood that the foregoing description is only for the description of the preferred embodiments of the present application, and is not intended to limit the scope of the present application. Any changes and modifications made by a person of ordinary skill in the art according to the foregoing application are all within the protection scope of the appended claims.

What is claimed is:

1. A pixel structure, comprising a plurality of pixel units arranged in an array, the plurality of pixel units being arranged respectively along a first direction and a second direction perpendicular to the first direction, each of the pixel units comprising a first sub-pixel, a second sub-pixel, and a third sub-pixel having different colors;
   in the second direction, a distance between the third sub-pixels being different from a distance between the first sub-pixels and being different from a distance between the second sub-pixels,
   wherein in each pixel unit, a total size of the first sub-pixel and the second sub-pixel is greater than a size of the third sub-pixel in the second direction.

2. The pixel structure according to claim 1, wherein in the second direction, the distance between the third sub-pixels is greater than the distance between the first sub-pixels, and is greater than the distance between the second sub-pixels.

3. The pixel structure according to claim 1, wherein in the second direction, the distance between the third sub-pixels is smaller than the distance between the first sub-pixels, and is smaller than the distance between the second sub-pixels.

4. The pixel structure according to claim 1, wherein the distance between the first sub-pixels is equal to the distance between the second sub-pixels.

5. The pixel structure according to claim 1, wherein in each pixel unit, a size of the pixel unit in the first direction is greater than a size of the pixel unit in the second direction.

6. The pixel structure according to claim 5, wherein in each pixel unit, a ratio of the size of the pixel unit in the first direction to the size of the pixel unit in the second direction is 3:2, 2:1, 4:3 or 5:4.

7. The pixel structure according to claim 1, wherein in a plurality of adjacent pixel units in the first direction, a size of a light-emitting region of the third sub-pixel in the first direction is incremented or decremented, the plurality of adjacent pixel units are performed as a plurality of repeat unit groups repeatedly arranged in the first direction and the second direction, or
   in a plurality of adjacent pixel units in the second direction, a size of a light-emitting region of the third sub-pixel in the second direction is incremented or decremented, and the plurality of adjacent pixel units are performed as a plurality of repeat unit groups repeatedly arranged in the first direction and the second direction.

8. The pixel structure according to claim 7, wherein a number of the plurality of adjacent pixel units is three or more.

9. The pixel structure according to claim 1, wherein in each pixel unit, the first sub-pixel and the second sub-pixel are arranged collinearly in the second direction, the third sub-pixel and the first sub-pixel and the second sub-pixel are arranged side by side in the first direction.

10. The pixel structure according to claim 1, wherein an inverted arrangement structure of each pixel unit is the same as an arrangement structure of a pixel unit adjacent to the pixel unit in the second direction, or
    an inverted arrangement structure of each pixel unit is the same as an arrangement structure of a pixel unit adjacent to the pixel unit in the first direction.

11. The pixel structure according to claim 1, wherein the first sub-pixel, the second sub-pixel and the third sub-pixel are respectively one of an R sub-pixel, a G sub-pixel, and a B sub-pixel.

12. The pixel structure according to claim 1, wherein: the first direction is a row direction and the second direction is a column direction; or
    the first direction is a column direction and the second direction is a row direction.

13. A display panel, comprising a pixel structure, wherein the pixel structure comprises a plurality of pixel units arranged in an array, the plurality of pixel units being arranged respectively along a first direction and a second direction perpendicular to the first direction, each of the pixel units comprising a first sub-pixel, a second sub-pixel, and a third sub-pixel having different colors;
    in the second direction, a distance between the third sub-pixels being different from a distance between the first sub-pixels, and being different from a distance between the second sub-pixels,
    wherein in each pixel unit, a total size of the first sub-pixel and the second sub-pixel is greater than a size of the third sub-pixel in the second direction.

* * * * *